United States Patent

Arai

Patent Number: 5,701,306
Date of Patent: Dec. 23, 1997

[54] SEMICONDUCTOR INTEGRATED CIRCUIT WHICH CAN BE TESTED BY AN LSI TESTER HAVING A REDUCED NUMBER OF PINS

[75] Inventor: Tomohisa Arai, Tokyo, Japan

[73] Assignee: NEC Corporation, Tokyo, Japan

[21] Appl. No.: 519,934

[22] Filed: Aug. 28, 1995

[30] Foreign Application Priority Data

Aug. 26, 1994 [JP] Japan ................. 6-224027

[51] Int. Cl.$^6$ ........................... G01R 31/28
[52] U.S. Cl. ......................... 371/22.1; 371/22.3
[58] Field of Search .................. 371/22.1, 22.3, 371/22.5, 15.1, 22.4; 307/303; 326/84, 62, 63

[56] References Cited

U.S. PATENT DOCUMENTS

| | | | |
|---|---|---|---|
| 4,887,267 | 12/1989 | Kanuma | 371/22.3 |
| 4,970,410 | 11/1990 | Matsushita et al. | 307/303 |
| 5,132,614 | 7/1992 | Sakumoto et al. | 324/158 R |
| 5,331,571 | 7/1994 | Aronoff et al. | 364/490 |
| 5,341,096 | 8/1994 | Yamamura | 324/765 |
| 5,341,380 | 8/1994 | Shoda | 371/22.3 |
| 5,404,056 | 4/1995 | Maeda | 326/84 |
| 5,465,257 | 11/1995 | Yamahata et al. | 371/22.5 |

FOREIGN PATENT DOCUMENTS

| | | |
|---|---|---|
| 0291581 | 11/1988 | European Pat. Off. . |
| 0503926 | 9/1992 | European Pat. Off. . |
| 2-78980 | 3/1990 | Japan . |
| 4-220576 | 8/1992 | Japan . |

*Primary Examiner*—Robert W. Beausoliel, Jr.
*Assistant Examiner*—Nadeem Iqbal
*Attorney, Agent, or Firm*—Sughrue,Mion,Zinn,Macpeak & Seas, PLLC

[57] ABSTRACT

An LSI (10) to be tested includes a high speed interface (50), a FIFO buffer (16) for temporarily storing data supplied from a high speed interface (50) to an internal circuit (11) of the LSI (10), a selector (24) outputting a selected one of an output of the internal circuit (11) and an output of the FIFO buffer (16) to the high speed interface (50), and a sequencer (17) responding to a test signal (TEST) to control the selector (24) so that the data supplied from the high speed interface (50) to the internal circuit (11) is looped back through the FIFO buffer (16) and the selector (24) to the high speed interface (50). Thus, the LSI (10) including a high speed interface (50) can be tested by use of a high speed LSI tester having a number of pins smaller than the number of all the function terminals of the LSI to be tested.

6 Claims, 7 Drawing Sheets

SEMICONDUCTOR INTEGRATED CIRCUIT WHICH CAN BE TESTED BY AN LSI TESTER HAVING A REDUCED NUMBER OF PINS

BACKGROUND OF THE INVENTION

1. Field of the Invention

The present invention relates to a semiconductor integrated circuit and a method for testing the same, and more specifically to a semiconductor configured to be tested for operation and characteristics of internal circuits in response to test data input from an external source.

2. Description of Related Art

In the process for developing and manufacturing semiconductor integrated circuits (called an "LSI" hereinafter), defects LSIs are distinguished from non-defective LSIs, and the causes of defective in the LSIs are investigated and analyzed in order to elevate quality and productivity. One method use in discovering and analyzing the defective LSIs is an LSI test.

This LSI test can be roughly divided into a function test and a parametric test.

The function test relates to the function of the LSI. For example, this test is performed by setting various parameters such as supply voltage, operation temperature, input signal timing, etc. to typical values expected at the time of development and manufacturing of the LSI, in order to know whether or not an expected function of the LSI is completely realized.

On the other hand, the parametric test relates to the operation condition range of the LSI. In this test, each of the parameters which determined the test condition for the function test is changed to determined whether or not the LSI exerts a predetermined function and exhibits a predetermined characteristic in an operation condition range defined by the specification of the LSI. Mainly, the parametric test includes a DC parametric test for testing DC characteristics and an AC parametric test for testing, for example, signal propagation delay between an input terminal and an output terminal, a characteristic of a timing edge.

A method for executing the above mentioned LSI tests, fundamentally includes inputting test data from an external apparatus to input terminals of an LSI to be tested, so that the result of an operation of an internal circuit of the LSI to be tested in response to the given test data is outputted to the external apparatus from output terminals of the LSI, and then observing the result of an operation obtained from the output terminals of the LSI. Using this method, the internal circuits of the LSI is tested.

Referring to FIG. 1, there is shown a block diagram illustrating a conventional LSI to be tested. The shown LSI is generally designated by Reference Numeral 20, and includes an internal circuit 21 constituted of sequential circuits and combinational circuits suitably combined to achieve desired functions. Test data is applied through input terminals 211 to 21X and input buffers 231 to 23X to the internal circuit 21, and data outputted from the internal circuit 21 is outputted through output buffers 241 to 24X and output terminals 221 to 22X to an external apparatus.

FIG. 2 illustrates a conventional manner in which the LSI shown in FIG. 1 is tested by an LSI tester. In FIG. 2, elements corresponding to those shown in FIG. 1 are given the same Reference Numerals.

In FIG. 2, the LSI tester is generally designated by Reference Numeral 3, and various pins of the LSI tester 3 are connected to the input terminals 211 to 21X and the output terminals 221 to 22X of the LSI 20 to be tested.

The LSI tester 3 generates test data corresponding to each item of the test, and supplies the generated test data to the input terminals 211 to 21X of the LSI 20. Thus, the test data is actually applied to the internal circuit 21 of the LSI 20. The internal circuit 21 performs an operation corresponding to each applied test data, and outputs the result of this operation as test result data, which is received through the output terminals 221 to 22X of the LSI 20 by the LSI tester 3, so that the defective or non-defective condition of the operation and characteristics of the LSI is discriminated. A series of operations such as the above mentioned operation are sequentially performed by the LSI tester 3 in accordance with a predetermined program, for the purpose of executing predetermined test items.

In the above mentioned LSI test method, however, it is required to apply the test data to all of the input terminals of the LSI, and fetch all the test result data of the LSI through all the output terminals of the LSI. Therefore, it is necessary to use an LSI tester having pins of the number corresponding to all function pins of an LSI to be tested, namely, a device under test (often abbreviated to "DUT").

In addition, the LSI tester is required to have a speed and precision sufficient to perform a timing test of the LSI to be tested.

Recently, the operation frequency of LSI devices has increased with advanced semiconductor technology, and therefore, a high speed LSI tester is required in order to test the high speed LSI. In other words, there is now required a high speed LSI tester having pins of the number corresponding to all function pins of an LSI to be tested and having a test rate corresponding to the operation frequency of the high speed LSI.

In general, a high speed LSI tester is more expensive than a low speed LSI tester. In the high speed LSI tester, in particular, the cost per pin is also higher than that in the low speed LSI tester. Accordingly, the high speed, multi-pin LSI tester is very expensive.

Because of recent elevated functions and the increased complication of LSI devices, the number of pins in LSI devices is apt to increase, and therefore, the expense for LSI testers will become correspondingly large.

On the other hand, all the function pins of a high speed LSI do not operate at a high speed. For example, in a high-speed serial communication LSI, only a few terminals for high-speed serial communication operate at an ultra high speed (a few hundred GHz to a few GHz), and most of the terminals only operate on the order of a few tens of MHz.

Therefore, from a viewpoint of both development cost and manufacturing cost, it is not convenient to make a high-speed multi-pin LSI tester having a number of pins, all of which have a speed and precision capable of performing at the highest speed of one of the terminals of the LSI to be tested.

Japanese Patent Application Laid-open Publication No. JP-4-220576 has proposed a testing method which can reduce the number of pins of the LSI tester required for a test. Referring to FIG. 3, there is illustrated the method proposed by JP-4-220576. As shown in FIG. 3, test data is supplied in the form of serial data to an LSI 40 to be tested, in which the serial test data is converted by a serial-to-parallel conversion circuit 43 into a plurality of parallel test data, which are supplied to a plurality of circuits 41*l* to 41*n* to be tested constituting the integrated circuit. With this arrangement, it is possible to reduce the number of test terminals of the LSI tester.

However, this proposed method can perform the function tests of the internal circuits of the LSI, but cannot perform a test for determining whether or not the timing of an external interface of the LSI to be tested can meet the specification of the LSI. Because the test data is supplied to the circuits to be tested in the LSI through the serial-to-parallel conversion circuit 43, the data actually applied to the circuits to be tested is different from the specification of the LSI.

SUMMARY OF THE INVENTION

Accordingly, it is an object of the present invention to provide a semiconductor integrated circuit which has overcome the above mentioned defect of the conventional one.

Another object of the present invention is to provide a semiconductor integrated circuit capable of testing a high speed interface of the semiconductor integrated circuit itself by using a high speed LSI tester having only pins of a necessary minimum number which is smaller than the total number of all functional terminals of the semiconductor integrated circuit to be tested.

The above and other objects of the present invention are achieved in accordance with the present invention by a semiconductor integrated circuit comprising:

an internal circuit;

an input means for receiving data from an external apparatus, for outputting the received data to the internal circuit;

an output means receiving a result of processing from the internal circuit, for outputting the result of processing to the external apparatus; and a loopback control means for receiving a test control signal indicating a test mode, and for looping back an output of the input means to the output means in the test mode without passing through said internal circuit.

Preferably, the loopback control means includes:

a storing means for storing the output of the input means;

a selector for receiving the result of processing from the internal circuit and an output of the storing means for outputting one of the result of processing and the output of the storing means selected in accordance with a selection signal; and a sequence control means responding to the test control signal, for generating the selection signal to be sent to the selector, and for controlling writing to and reading of the storing means in the test mode.

In addition, the storing means can be constituted of a first-in first-out buffer memory.

According to another aspect of the present invention, there is provided a semiconductor integrated circuit comprising:

a timing input means for receiving a timing signal from an external apparatus;

a data input means for receiving input data from the external apparatus;

a data output means for outputting an output to the external apparatus;

a latch means for latching the data supplied through the data input means on the basis of the timing signal;

a gate means for controlling a supply of data to the data output means on the basis of the timing signal;

a loopback means for looping back the data latched in the latch means to the gate means; and a loopback activating means for activating the loopback means.

Preferably, the loopback means includes a memory for storing the loopback data. In addition, the loopback means also includes means for controlling the loopback data stored in the memory. Furthermore, the loopback activating means controls a loopback mode in response to a predetermined signal from the external apparatus.

The above and other objects, features and advantages of the present invention will be apparent from the following description of preferred embodiments of the invention with reference to the accompanying drawings.

DESCRIPTION OF THE PREFERRED EMBODIMENTS

Figure 1:
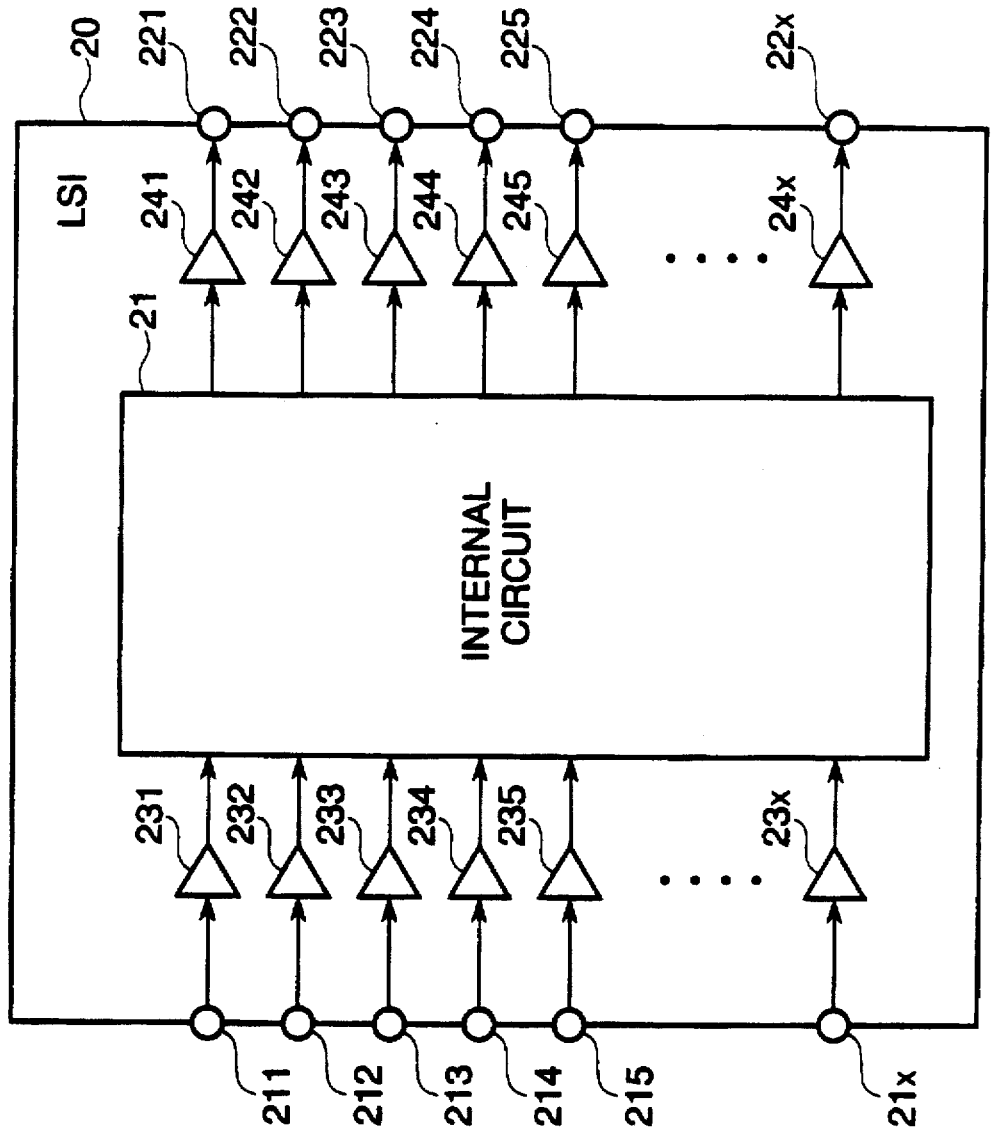
FIG. 1 is a block diagram illustrating a conventional LSI to be tested.
Figure 2:
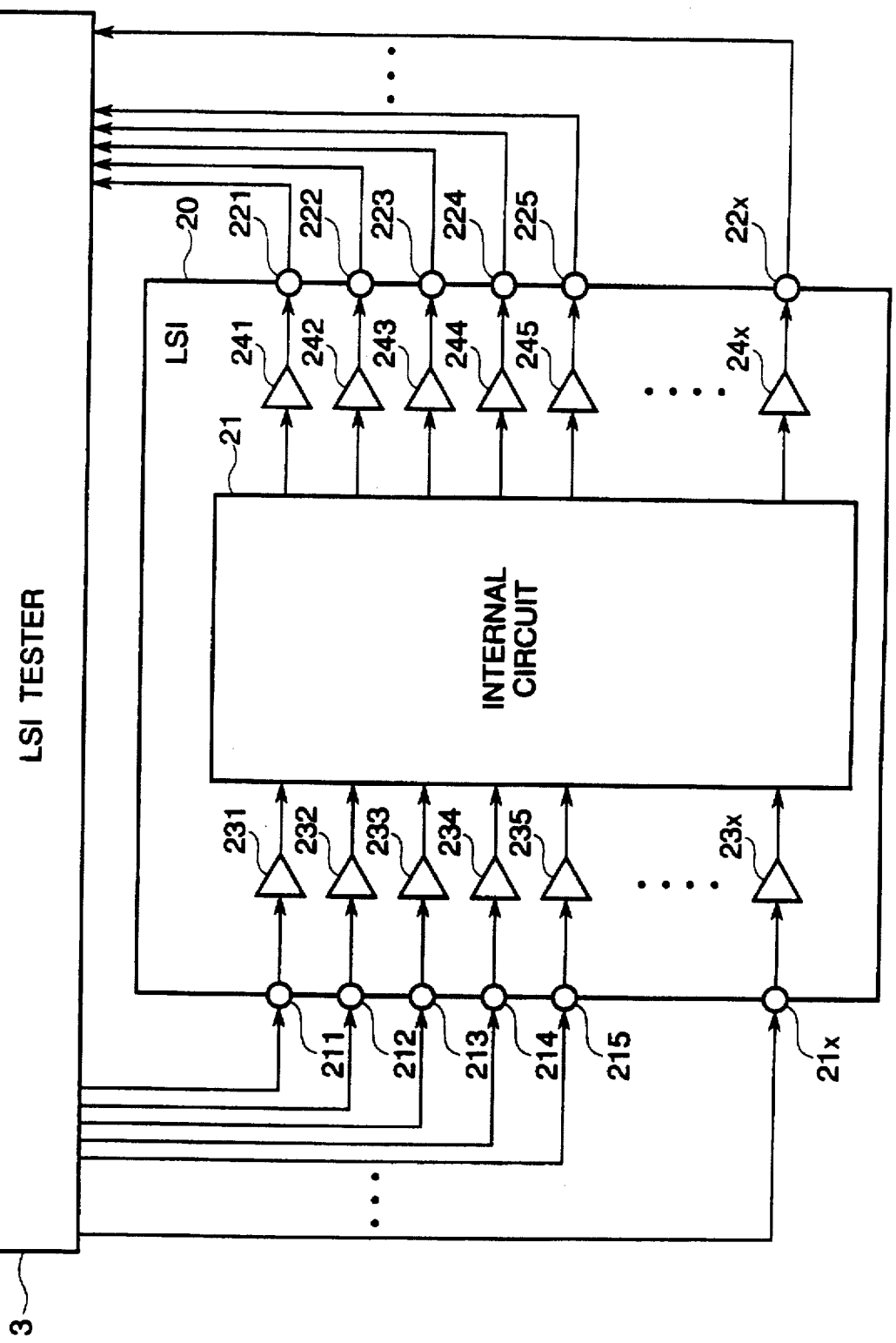
FIG. 2 illustrates a conventional manner in which the LSI shown in FIG. 1 is tested by a conventional LSI tester.
Figure 3:
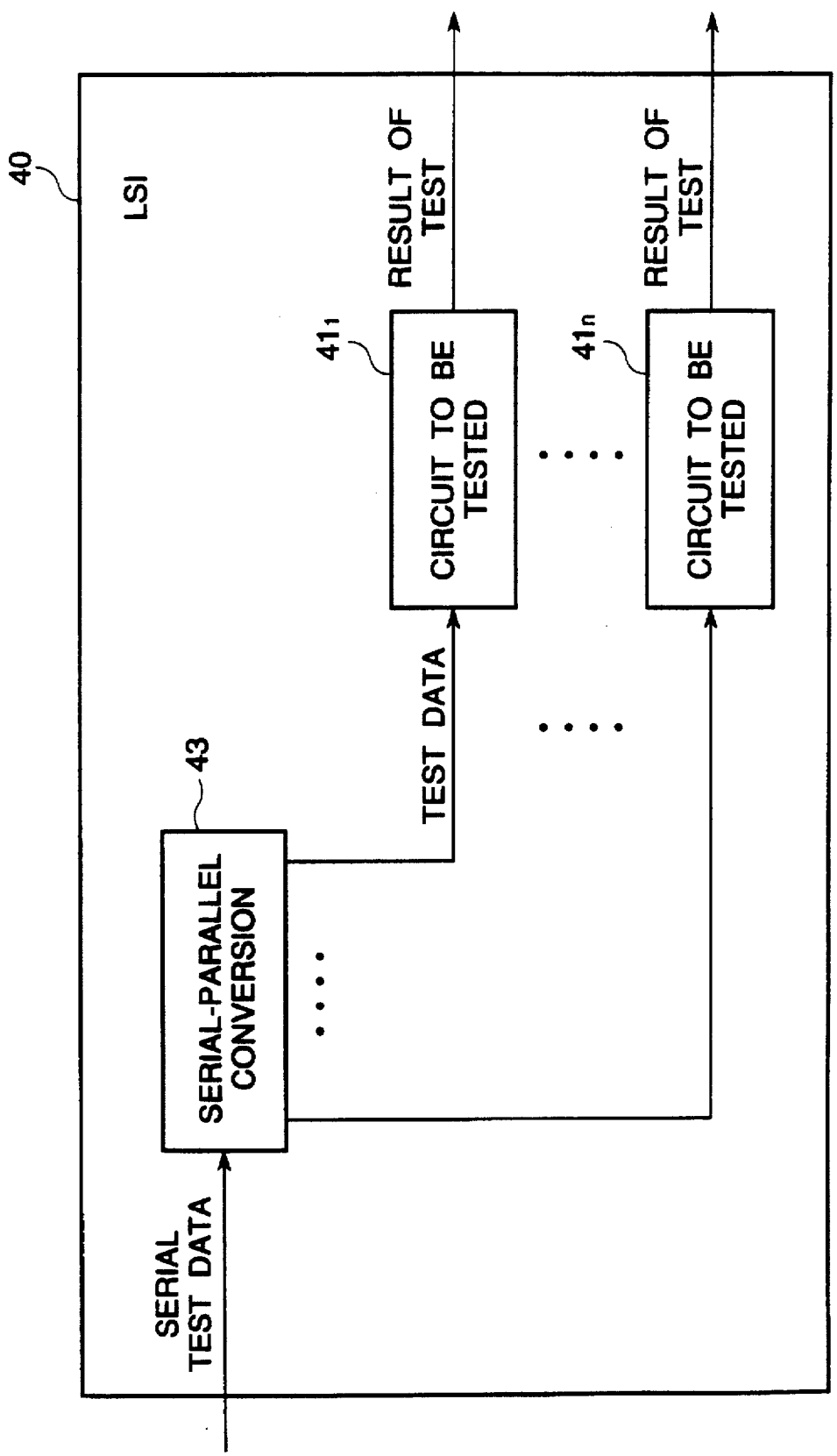
FIG. 3 illustrates a conventional testing method which can reduce the number of pins of the LSI tester.
Figure 4:
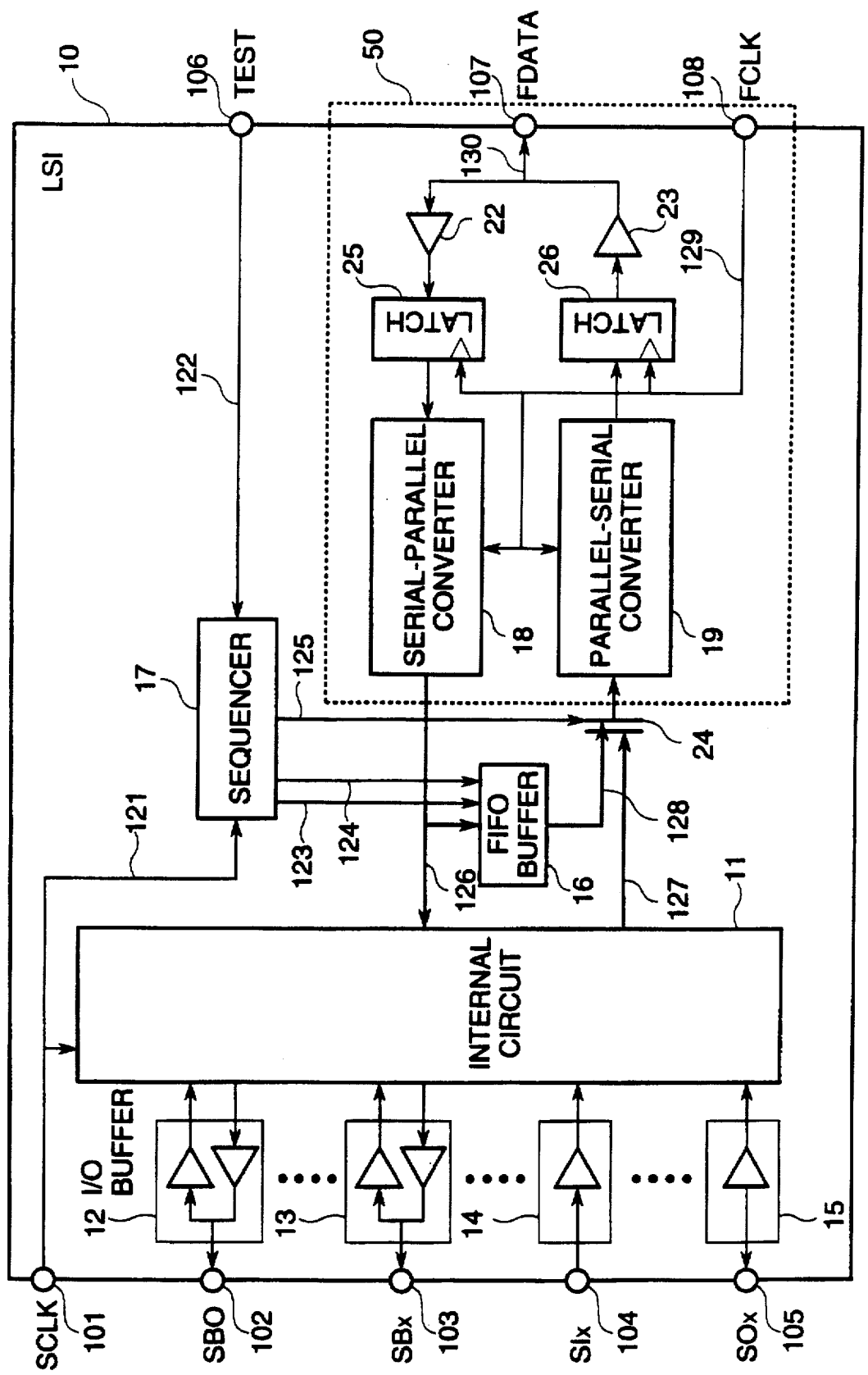
FIG. 4 is a block diagram of one embodiment of the semiconductor integrated circuit in accordance with the present invention.

Referring to FIG. 4, there is shown a block diagram of one embodiment of the semiconductor integrated circuit in accordance with the present invention.

In FIG. 4, an LSI is generally designated by Reference Numeral 10, and includes an internal circuit 11 operating at a slow clock, input/output buffers 12 and 13, an input buffer 14, an output buffer 15, a FIFO (first-in first out) buffer 16, a sequencer 17 for controlling a loopback operation explained hereafter, a serial-to-parallel converter 18, a parallel-to-serial converter 19, an input latch 25, an output latch 26, an input buffer 22, an output buffer 23 and a selector 24, which are connected as shown. A portion surrounded by a dotted line 50 is a high speed interface portion which operates with a fast clock.

In addition, Reference Numerals 101 to 108 designate external terminals, and Reference Numeral 121 indicates a slow clock. Reference Numeral 122 shows a test control signal for starting a loopback test. Reference Numeral 123 is a write signal for the FIFO buffer 16, and Reference Numeral 124 is a read signal for the FIFO buffer 16. Reference Numeral 125 designates a switchover control signal for switching a data path in a loopback test mode. Reference Numeral 126 shows a data bus for transferring the parallel input obtained from the serial-to-parallel converter 18, into the internal circuit 11. Reference Numeral 127 is a data bus for transferring output data of the internal circuit 11 to the selector 24. Reference Numeral 128 indicates an output data bus of the FIFO buffer 16 coupled to the selector 24. Reference Numeral 129 is a fast clock signal, and Reference Numeral 130 designates a fast data input/output bus.

Now, operation Of the shown LSI in accordance with the present invention will be described. Here, assume that data is transferred between a low speed interface which is shown at the left of FIG. 4 and which operates with the slow clock SCLK, and a high speed interface which is shown at the right of FIG. 4 and operating with the fast clock FCLK.

Data supplied through the terminals 102, 103 and 104 to the LSI 10 is applied to the internal circuit 11 of he LSI 10 through the buffers 12, 13 and 14. The input data is processed in the internal circuit 11, and thereafter, the result of processing is supplied through the data bus 127 and the selector 24 to the parallel-to-serial converter 19, which is converted into serial fast data. The serial fast data is outputted through the output latch 26 driven by the fast clock FCLK, and through the output buffer 23, and also through the fast data input/output bus 130 to the terminal 107 as fast data.

Data transfer from the high speed interface to the low speed interface is made as follows: The fast data FDATA supplied through the terminal 107 is fed through the fast data input/output bus 130 and the input buffer 22 and latched in the latch 25 in synchronism with the fast clock FCLK supplied through the terminal 108.

The data latched in the input latch 25 is converted by the serial-to-parallel converter 18 into low speed parallel data, which is supplied through the data bus 126 to the internal circuit 11. After the data is processed in the internal circuit 11, the result of processing is outputted through the buffer 12, 13 and 15 to the low speed interface terminals 102, 103 and 105.

Next, a loopback operation in the LSI of this embodiment will be described.

The loopback operation is started in response to the test control signal TEST supplied through the terminal 106. When the loopback operation is started, the sequencer 17 activates the switchover control signal 125 for switching the data path for the loopback test. In response to the switchover control signal 125, the selector 24 selects the output of the FIFO buffer 16, so that the output data bus 128 of the FIFO buffer 16 is coupled to the input of the parallel-to-serial converter 19.

In this case, the data applied to the terminal 107 is supplied through the input buffer 22 and the input latch 25 as mentioned above to the serial-to-parallel converter 18, and is convened by the serial-to-parallel converter 18 to slow data, which is outputted to the data bus 126. The sequencer 17 activates the FIFO buffer write signal 123 so that the data on the data bus 126 is written into the FIFO buffer 16. This writing of the data into the FIFO buffer 17 is performed the number of times set in the sequencer 17, so that a loopback data is prepared.

Thereafter, the sequencer 17 activates the FIFO buffer read signal 124, so that the loopback data prepared in the FIFO buffer 16 is read out to the output data bus 128 and supplied through the selector 24 to the parallel-to-serial converter 19. The read-out data is converted by the parallel-to-serial converter 19 into fast data, which is outputted through the output latch 26 and the output buffer 23 to the terminal 107.

Figure 5:
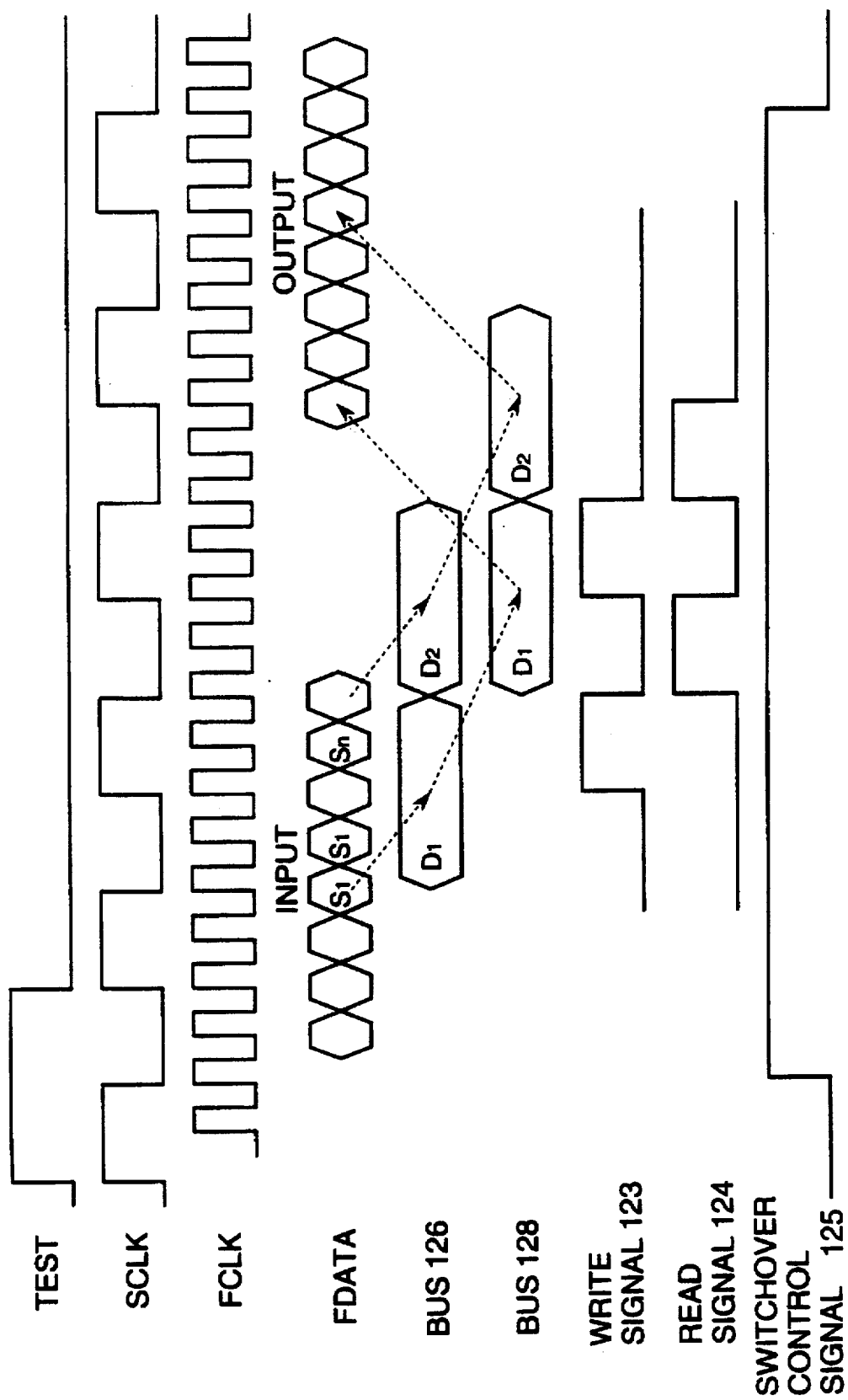
FIG. 5 is a timing chart illustrating the operation timing in the loopback operation of the first embodiment.

FIG. 5 is a timing chart illustrating the operation timing in the loopback operation of the above mentioned LSI in accordance with the present invention. In FIG. 5, "TEST" indicates the test control signal 122. SCLK shows the slow clock signal 121, and FCLK indicates the fast clock signal 129. FDATA shows the fast data 130. "BUS 126" indicates data on the data bus 126 for transferring the data from the serial-to-parallel converter 18 to the internal circuit 11, and "BUS 128" shows data on the output data bus 128 of the FIFO buffer 16. In addition, "WRITE SIGNAL 123 indicates the FIFO buffer write signal 123, and "READ SIGNAL 124" shows the FIFO buffer read signal 124. "SWTICHOVER CONTROL SIGNAL 125" designates the switchover control signal 125 supplied from the sequencer 17 to the selector 24.

Referring to FIG. 5, the writing to the FIFO buffer 16 is performed at a rising edge of the write signal 123, and the reading from the FIFO buffer 16 is performed at a rising edge of the read signal 124.

Also referring to FIG. 5, in response to the active test control signal TEST supplied through the terminal 106, the sequencer 17 starts to control the loopback operation. First, the sequencer 17 activates the switchover control signal 125 into a logical high level, so that the selector 24 selects the output data bus 128 of the FIFO buffer 16. Thus, the fast serial data FDATA supplied through the terminal 107 is converted by the serial-to-parallel converter 18 to parallel data on the data bus 126, and the data on the data bus 126 is written into the FIFO buffer 16 in order in accordance with the FIFO buffer write signal 123 from the sequencer 17. The data written into the FIFO buffer 16 is read out in accordance with the FIFO buffer read signal 124 from the sequencer 17, and outputted to the output data bus 128, so that it is converted by the parallel-to-serial converter 19 to the fast data which is outputted through the terminal 107.

In the example shown in FIG. 5, the writing of second data D2 into the FIFO buffer 16 from the data bus 126 overlaps in time with the reading-out of first data D1 written in the FIFO buffer 16 to the output data bus 128. However, the embodiment is not limited to this situation. For example, after a predetermined amount of data is written into the FIFO buffer 16, the data written in the FIFO buffer 16 can be read out.

Figure 6:
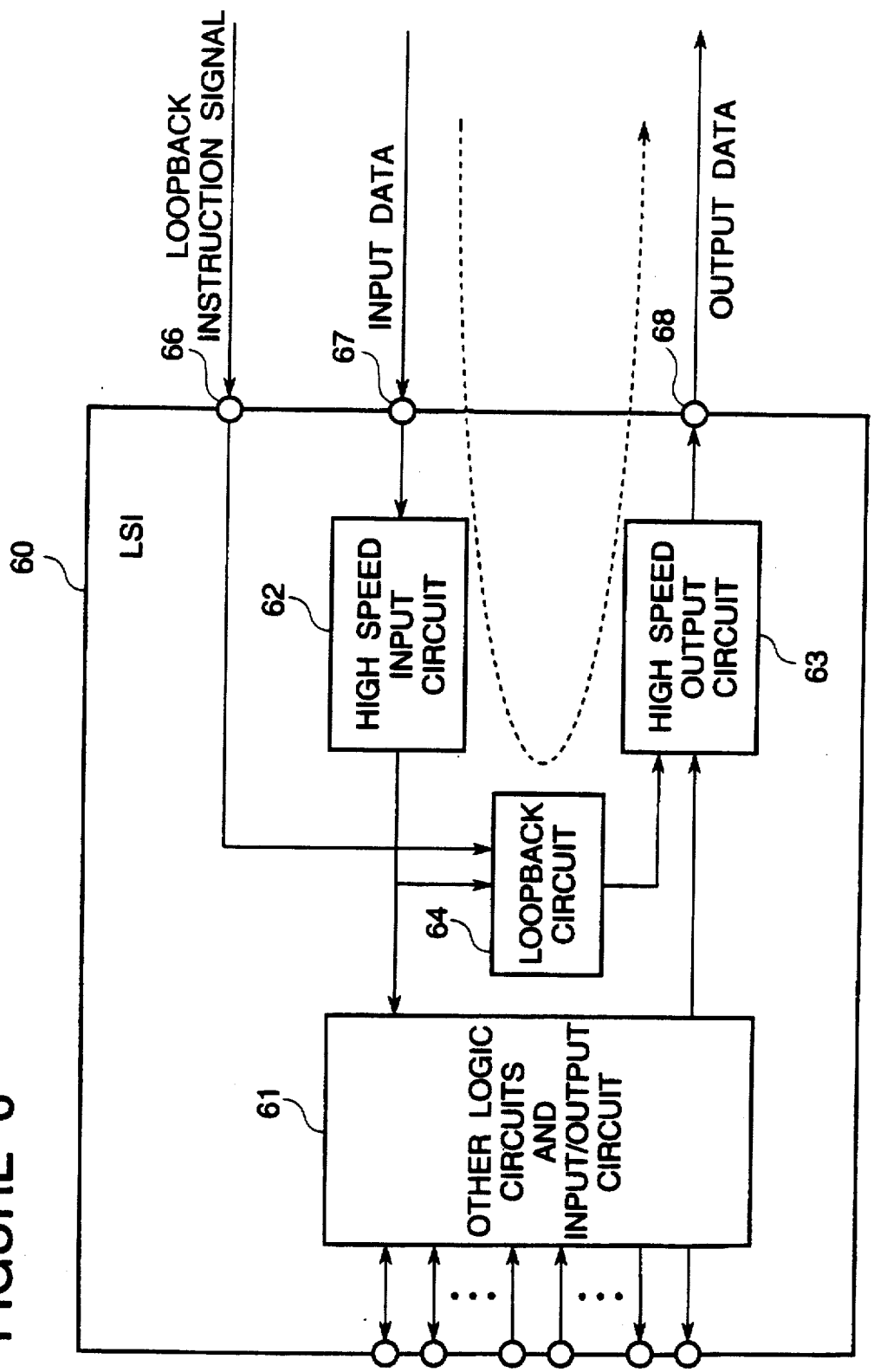
FIG. 6 illustrates a principle of loopback operation in the semiconductor integrated circuit in accordance with the present invention.

Referring to FIG. 6, there is illustrated a principle of the loopback testing in the above mentioned embodiment of the LSI in accordance with the present invention.

As seen from FIG. 6, a test pattern given as an input data 67 from an external apparatus is observed as an output data 68 in the external apparatus. Thus, this test makes it possible to test a high speed interface of an LSI 60 including a high speed input circuit 62 and a high speed output circuit 63. A loopback circuit 64 responds to a loopback instruction signal 66 for setting the LSI 60 into a loopback operation mode, and turns back the signals supplied from the high speed input circuit 62 into the high speed output circuit 63.

Incidentally, in the embodiment shown in FIG. 4, the fast data (FDATA) is inputted and outputted through the input/output terminal 107, but the input data terminal and the output data terminal can be provided independently of each other as shown in FIG. 6.

Figure 7:
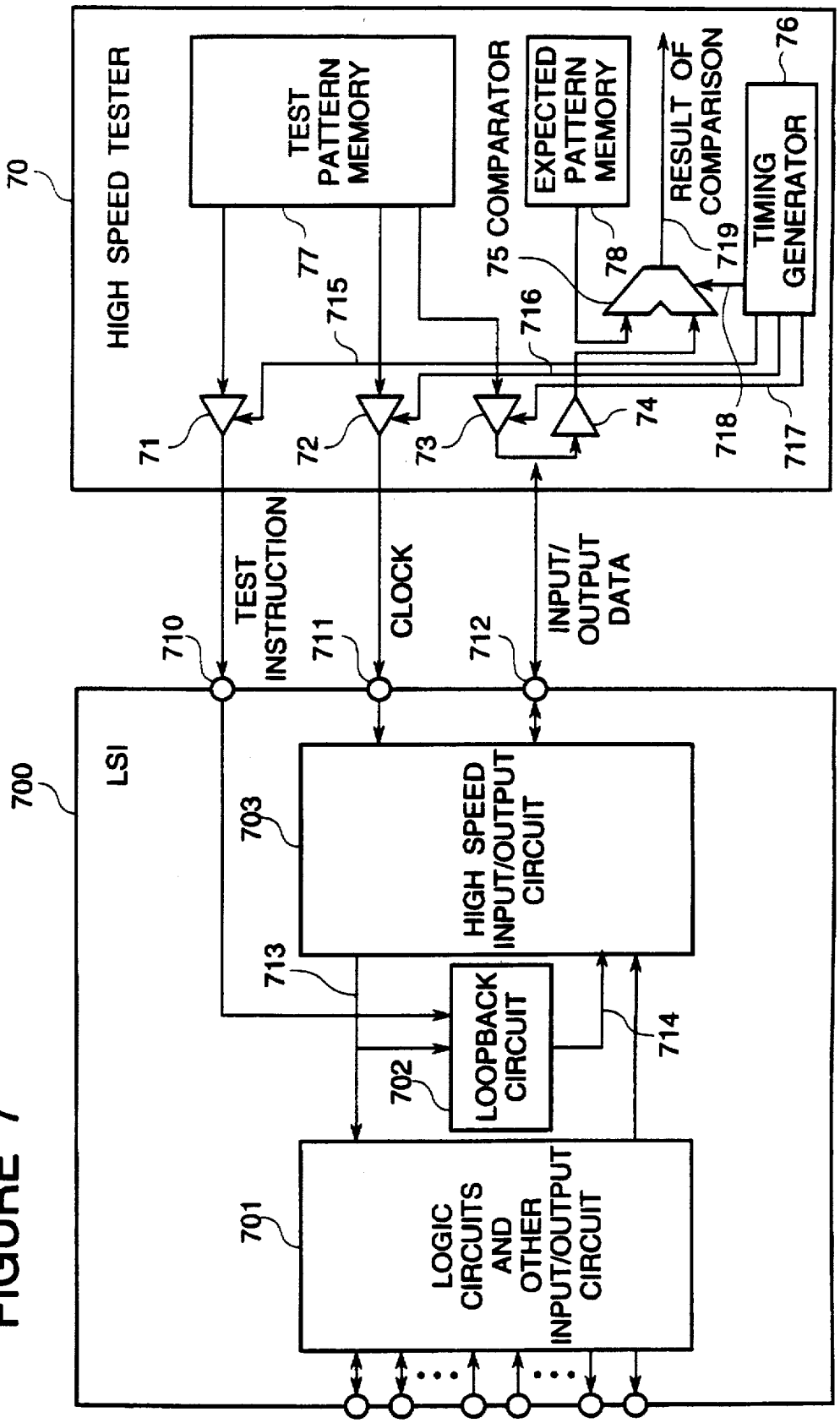
FIG. 7 is a block diagram of a system for testing a high-speed interface of the semiconductor integrated circuit in accordance with the present invention.

Referring to FIG. 7 there is shown a block diagram of a system for testing the high-speed interface of the first embodiment of the LSI in accordance with the present invention.

In FIG. 7, Reference Numeral 70 designates a high speed LSI tester, which includes a plurality of output drivers 71 to 73, an input buffer 74, a comparator 75, a timing generator 76, a test pattern memory 77 and an expected value pattern memory 78, which are coupled as shown.

In addition, Reference Numeral 700 designates an LSI in accordance with the present invention, which corresponds to the first embodiment shown in FIG. 4. Reference Numeral 701 shows logic circuits and input/output circuits other than a high speed interface. The high speed interface includes a loopback circuit 702 and a high speed input/output circuit 703.

Reference Numeral 710 designates an input terminal for receiving an LSI test instruction signal, and Reference Numeral 711 shows a fast clock input terminal. Reference Numeral 712 indicates a fast data input/output terminal. Reference Numeral 713 designates an internal bus for transferring the input data to the logic circuits and input/output circuits 701, and Reference Numeral 714 shows loopback data outputted from the loopback circuit 702.

In the high speed LSI tester 70, Reference Numerals 715 to 717 designate a timing signal generated by the timing generator 76 for designating the timing of outputting a test pattern supplied from the test pattern memory, to the LSI 700 to be tested. Reference Numeral 718 shows a strobe signal to be supplied to the comparator 75, for indicating where timing when an output of the LSI 700 under test is compared with the expected pattern from the expected pattern memory 78. Reference Numeral 719 indicates an output of the comparator 75 indicating the result of comparison.

Now, operation of the high speed LSI tester 70 will be described with reference to FIG. 7.

The test pattern memory 77 stores a number of test patterns to be supplied to the terminals of the LSI 700. The test patterns stored in the test pattern memory 77 are sequentially read out to be supplied from the high speed LSI tester 70 through the output drivers 71 to 73 to the LSI 700. The signals outputted from the high speed LSI tester 70 are controlled by the timing signals 715 to 717 generated in the timing generator 76.

The LSI 700 performs an operation in accordance with the given test pattern, and the result of operation is outputted from the input/output terminal 712. The high speed LSI tester 70 fetches the result of operation of the LSI 700 through the input buffer 74, and the result of the operation is compared in the comparator 75 with an operation expected value pattern stored in the expected value pattern memory 78 at a time designated by the timing signal 718 generated by the timing generator 76. The comparison result signal 719 is outputted from the comparator 75.

In the following, an example of an AC parametric test in the LSI testing system shown in FIG. 7 will be described in connection with an input setting time (setup time), an input hold time (hold time) and an output delay time of input/output data 712 (data inputted or outputted through the terminal 712) of the LSI 700 with reference to a clock 711 (applied to the terminal 711).

First, testing of the delay time of the output data of the LSI 700 will be explained.

The patterns stored in the test pattern memory 77 are read out, and the signal is given through the terminal 710 to the LSI 700. With this, as mentioned in connection with the first embodiment, the LSI 700 is put in the loopback test mode.

Then, in accordance with the patterns read out from the test pattern memory 71, the clock signal is applied to the clock terminal 711 and the input data is supplied to the input/output terminal 712. At this time, the timing signals 716 and 717 generated in the timing generator 76 are controlled to ensure that the input data is supplied through the high speed input/output circuit 703 into the internal circuit of the LSI 700 with timing that gives the input data a sufficient margin in comparison with the clock signal.

The input data is looped back by the loopback circuit 702 through the high speed input/output circuit 703 after a predetermined time, with the result that the looped-back data is outputted through the input/output terminal 712.

The high speed LSI tester 70 receives this outputted looped-back data through the input buffer 74, and the comparator 75 compares the received looped-back data with the expected value pattern stored in the expected value pattern memory 78 at a time designated by the timing signal 718 generated by the timing generator 76. Thus, the comparison result signal 719 is outputted from the comparator 75.

Here, by setting the timing signal 718 to the maximum value of the output delay time of the input/output data, it is possible to test whether or not the output data outputted from the input/output terminal 712 meets the standard of the output delay time.

Next, the setting time and the holding time of the input data of the LSI to be tested will be explained.

In this case, it is sufficient if the output timing of the data is controlled such that the timing of the input data given to the input/output terminal 712 is the minimum value of the input setup time or the minimum value of the hold time.

If the LSI setup time and hold time meets the standard, the input data is properly inputted to the high speed input/output circuit 703 with the loopback procedure mentioned above, and the same data as the input data can be observed as the looped-back output data. Therefore, when the received pattern is compared with the expected value pattern, they are coincident. If the LSI setup time and hold time does not meet the standard, the result of comparison indicates inconsistency. In this way, a defective LSI can be detected.

By setting the timing of the input/output signal in accordance with the standard value and by performing the function testing of the LSI, it is also possible to perform a test to determine whether or not the AC parameter values meet the standard values. This non-defective/defective test is ordinarily called a "GO/NOGO TEST", and is performed in a mass production test.

As seen from the above, by separately and sequentially performing the test of the high speed input/output circuit 703 of the LSI 700 by use of the loopback circuit 702, it is possible to perform a test using a high speed LSI tester 70 having a reduced number of pins in comparison with the total number of terminals of the LSI 700. Therefore, if the LSI to be tested includes a plurality of high speed input/output circuits 703, it is sufficient if the high speed LSI tester 70 has a timing precision required by the high speed input/output circuits and a required number of (high speed) pins corresponding to the number of pins of the high speed input/output circuits.

Therefore, if connected to the high speed interface of the LSI, a high speed LSI tester having only a small number of high speed pins can quickly and precisely perform not only the function test, but also the parametric test, such as whether or not the AC parameter meets the standard value. On the other hand, if connected with the low speed interface of the LSI, for example, a multi-pin low speed LSI tester can be used. Accordingly, test expense can be reduced.

In addition, the test method in accordance with the present invention can reduce the number of high speed test probes of the high speed LSI tester required for testing an LSI having a high speed interface. In this way test expense can be also reduced.

An LSI according to the present invention includes a loopback testing circuit operating in response to a test control signal, consisting of a control circuit for realizing the loopback control, a storing circuit for storing the output data from the high speed input circuit, and a selector for selecting either the output of the internal circuit or the output of the storing circuit. Therefore, the loopback circuit is very compact, and the expense of the LSI including the testing circuit can be reduced.

The invention has been shown and described with reference to specific embodiments. However, it should be noted that the present invention is in no way limited to the details of the illustrated structures, and changes and modifications may be made within the scope of the appended claims.

I claim:

1. A semiconductor integrated circuit comprising:

an internal circuit;

input means for receiving data from an external apparatus, and for outputting the received data to said internal circuit;

output means for receiving a result of processing from said internal circuit, and for outputting the result of processing to the external apparatus; and loopback control means for receiving a test control signal indicating a test mode, and for looping back an output of said input means to said output means in said test mode without passing said output of said input means through said internal circuit, said loopback control means including:

storing means for storing said output of said input means;

a selector for receiving said result of processing from said internal circuit and an output of said storing means, and for outputting one of said result of processing and said output of said storing means selected in accordance with a selection signal; and sequence control means for responding to said test control signal, for generating said selection signal to said selector, and for controlling writing and reading of said storing means in said test mode.

2. A semiconductor integrated circuit claimed in claim 1 wherein said storing means comprises a first-in first-out buffer memory.

3. A semiconductor integrated circuit comprising:

timing input means for receiving a timing signal from an external apparatus;

data input means for receiving input data from the external apparatus;

data output means for outputting an output to the external apparatus;

latch means for latching said data input from said data input means on the basis of said timing signal;

gate means for controlling a supply of data to said data output means on the basis of said timing signal;

loopback means for looping back the data latched in said latch means to said gate means, said loopback means having a memory for storing said data latched in said latch means, and means for controlling data stored in said memory; and loopback activating means for activating said loopback means, wherein said loopback activating means controls a loopback mode in response to a predetermined signal from said external apparatus.

4. A semiconductor integrated circuit comprising:

an internal circuit;

data input means for receiving input data from an external apparatus and outputting the received data to said internal circuit;

data output means for receiving a result of processing from said internal circuit and outputting the result of processing to said external apparatus;

a FIFO buffer for storing said output of said data input means in response to a write signal, and for reading out said output of said data means in response to a read signal;

a selector for receiving said result of processing from said internal circuit and said readout of said FIFO buffer, and for outputting one of said result of processing and said readout of said FIFO buffer, selected in accordance with a selection signal, to said data output means; and a sequencer, responsive to a test control signal indicating a test mode, for generating said write signal to said FIFO buffer, and thereafter generating said read signal to said FIFO buffer and said selection signal to said selector, thereby looping back said output of said data input means to said data output means in said test mode without passing said output of said data input means through said internal circuit.

5. A semiconductor integrated circuit as claimed in claim 4, further comprising timing input means for receiving a timing signal from an external apparatus, wherein said data input means comprises an input buffer for holding said input data, and an input latch for latching said input data the basis of said timing signal; and wherein said data output means comprises an output latch for latching said output of said data input means or said result of processing on the basis of said timing signal, and an output buffer for holding said output of said data input means or said result of processing.

6. A semiconductor integrated circuit as claimed in claim 5, wherein said input data is fast data, said data input means further comprises a serial-parallel converter for converting said input data to slow data to be processed by said internal circuit or looped back in said test mode, and said data output means further comprises a parallel-serial converter for converting said result of processing or said looped back data to fast data.

* * * * *